United States Patent
Ozaki et al.

(10) Patent No.: US 11,585,907 B2
(45) Date of Patent: *Feb. 21, 2023

(54) OPTICAL MEASURING DEVICE COMPRISING A MEASURING UNIT TO GENERATE TIME INFORMATION REPRESENTING AN ELAPSED TIME IN ACCORDANCE WITH PULSE SIGNAL OUTPUT FROM A LIGHT RECEIVING GROUP

(71) Applicant: DENSO CORPORATION, Kariya (JP)

(72) Inventors: Noriyuki Ozaki, Kariya (JP); Teiyu Kimura, Kariya (JP); Kenta Azuma, Kariya (JP); Takehiro Hata, Kariya (JP)

(73) Assignee: DENSO CORPORATION, Kariya (JP)

( * ) Notice: Subject to any disclaimer, the term of this patent is extended or adjusted under 35 U.S.C. 154(b) by 582 days.

This patent is subject to a terminal disclaimer.

(21) Appl. No.: 16/597,109

(22) Filed: Oct. 9, 2019

(65) Prior Publication Data

US 2020/0041621 A1 Feb. 6, 2020

Related U.S. Application Data

(63) Continuation of application No. PCT/JP2018/014797, filed on Apr. 6, 2018.

(30) Foreign Application Priority Data

Apr. 10, 2017 (JP) .............................. JP2017-077484
Mar. 16, 2018 (JP) .............................. JP2018-049416

(51) Int. Cl.
*G01S 17/10* (2020.01)
*G01S 7/4865* (2020.01)
(Continued)

(52) U.S. Cl.
CPC .......... *G01S 7/4865* (2013.01); *G01S 7/4863* (2013.01); *G01S 7/4873* (2013.01); *G01S 17/08* (2013.01); *H01L 31/107* (2013.01)

(58) Field of Classification Search
CPC .......... G01S 17/00; G01S 17/04; G01S 17/06; G01S 17/10; G01S 17/14; G01S 17/66;
(Continued)

(56) References Cited

U.S. PATENT DOCUMENTS 10,539,663 B2 * 1/2020 Liu .......................... H03G 3/32

FOREIGN PATENT DOCUMENTS

JP 2014-081254 A 5/2014

* cited by examiner

*Primary Examiner* — Que Tan Le
(74) *Attorney, Agent, or Firm* — Maschoff Brennan

(57) ABSTRACT

A plurality of photodetectors form a light receiving group, and a plurality of the light receiving groups form one pixel. A light receiving array is provided with one or more of such pixels. The photodetectors each output a pulse signal in response to irradiation of a photon. A measuring unit is provided for each of the plurality of light receiving groups. The measuring unit generates time information representing an elapsed time from an irradiation timing input from outside and light quantity information acquired at each of one or more timings identified from the time information, in accordance with the pulse signal output from the light receiving group. The number of the photodetectors outputting the pulse signal among the plurality of photodetectors belonging to the light receiving group is used as the light quantity information.

14 Claims, 13 Drawing Sheets

(51) Int. Cl.
*G01S 7/487* (2006.01)
*H01L 31/107* (2006.01)
*G01S 17/08* (2006.01)
*G01S 7/4863* (2020.01)

(58) Field of Classification Search
CPC .......... G01S 17/86; G01S 17/88; G01S 17/89; G01S 17/93; G01S 7/48; H01L 31/107
USPC .................................. 250/214 R, 221, 208.1
See application file for complete search history.

FIG.2
TIME BIN REPRESENTED BY TIME INFORMATION Tp (= DISTANCE)
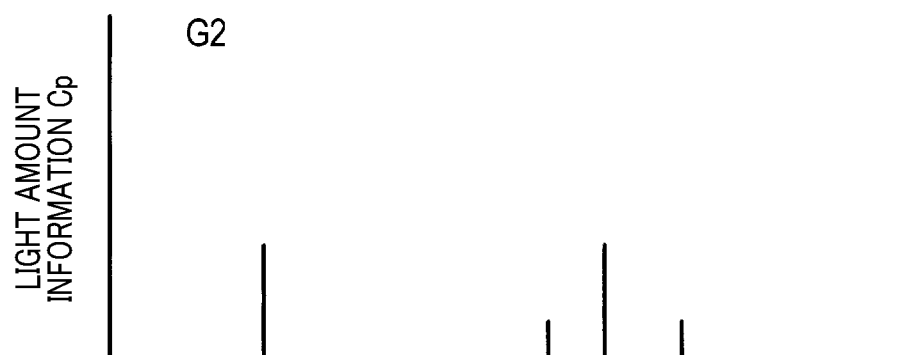
TIME BIN REPRESENTED BY TIME INFORMATION Tp (= DISTANCE)
⋮
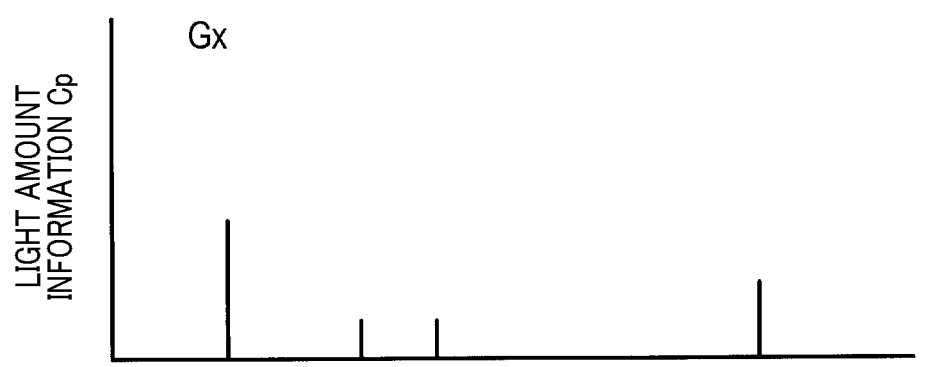
TIME BIN REPRESENTED BY TIME INFORMATION Tp (= DISTANCE)

FIG.7
| ASSIGNMENT EXAMPLE | AMBIENT SITUATION |
|---|---|
| 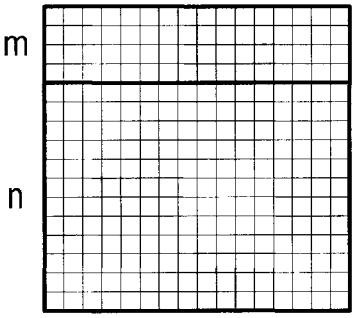 | ex. STRONG DISTURBANCE LIGHT 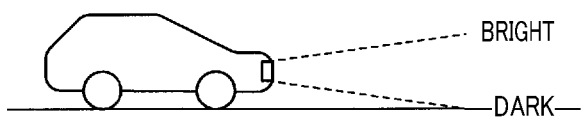 BRIGHT / DARK |
| 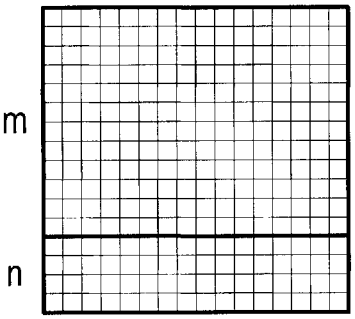 | ex. SNOW ROAD 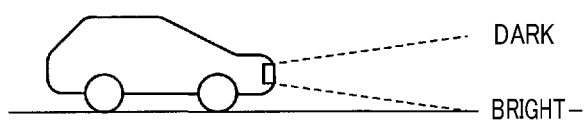 DARK / BRIGHT |

FIG.9
| ASSIGNMENT EXAMPLE | VEHICLE STATE |
|---|---|
| 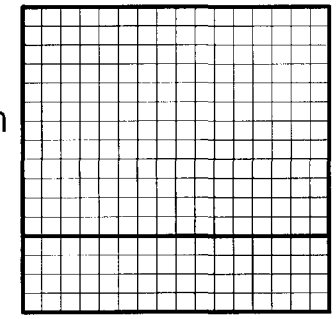 | 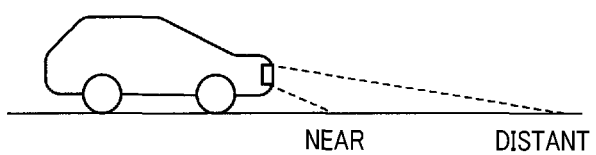<br>NEAR     DISTANT |
FIG.10
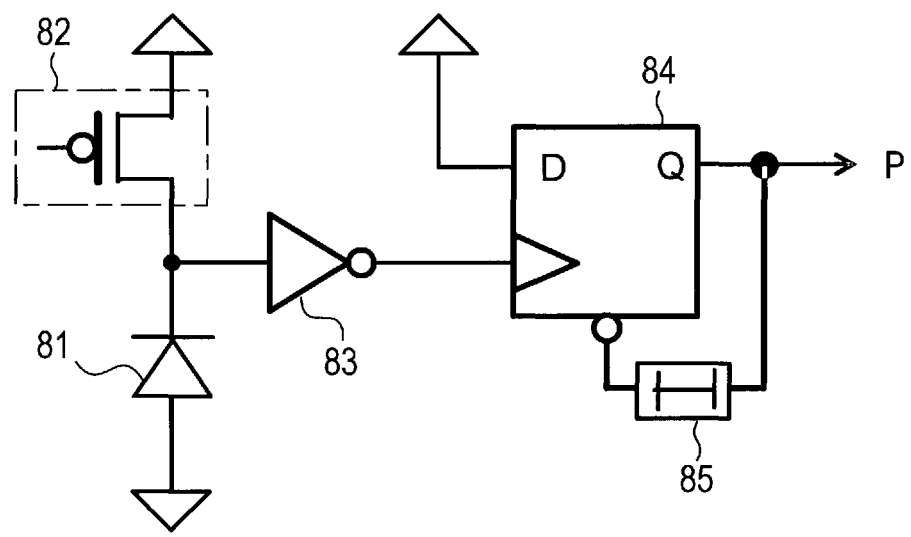

OPTICAL MEASURING DEVICE COMPRISING A MEASURING UNIT TO GENERATE TIME INFORMATION REPRESENTING AN ELAPSED TIME IN ACCORDANCE WITH PULSE SIGNAL OUTPUT FROM A LIGHT RECEIVING GROUP

CROSS-REFERENCE TO RELATED APPLICATION

The present application is a continuation application of International Application No. PCT/JP2018/014797, filed on Apr. 6, 2018, which claims priority to Japanese Patent Application No. 2017-077484 filed Apr. 10, 2017 and Japanese Patent Application No. 2018-049416 filed Mar. 16, 2018, the entire contents of which are incorporated herein by reference.

TECHNICAL FIELD

The present disclosure relates to an optical measuring device for obtaining a time of flight of light.

BACKGROUND

A photodetector uses a SPAD array in which a plurality of SPADs are arranged to count the number of pulse signals (hereinafter, number of responses) output from the individual SPADs on which a photon is incident, thereby detecting the light receiving intensity. SPAD is an abbreviation for Single Photon Avalanche Diode. SPAD is an avalanche diode which operates in a Geiger mode and can detect the incidence of a single photon.

SUMMARY

In an optical measuring device according to an aspect, the optical measuring device includes a light receiving array unit configured in such a manner that a plurality of photodetectors each output a pulse signal in response to incidence of a photon form a light receiving group and that a plurality of the light receiving groups form one pixel, the light receiving array unit being provided with one or more of the pixels, a measuring unit provided for each of the plurality of light receiving groups, and the measuring unit being configured to generate time information representing an elapsed time from an irradiation timing input from outside and light quantity information acquired at each of one or more timings identified from the time information, in accordance with the pulse signal output from the light receiving group, and a signal processing unit configured to determine a time of flight of light in accordance with at least one of the time information and the light quantity information measured at a plurality of the measuring units corresponding to the one pixel. The number of the photodetectors outputting the pulse signal among the plurality of photodetectors belonging to the light receiving group is used as the light quantity information.

BRIEF DESCRIPTION OF THE DRAWINGS

In the accompanying drawings:
FIG. 2 is an explanatory view illustrating the contents of individual memories;
FIG. 7 is an explanatory view illustrating the way of assignment of light receiving groups to a measuring unit;
FIG. 9 is an explanatory view illustrating the way of assignment of light receiving groups to a histogram generating unit;
FIG. 10 is a circuit diagram showing the configuration of a photodetector in the first to third embodiments.

DETAILED DESCRIPTION OF THE PREFERRED EMBODIMENTS

Figure 1:
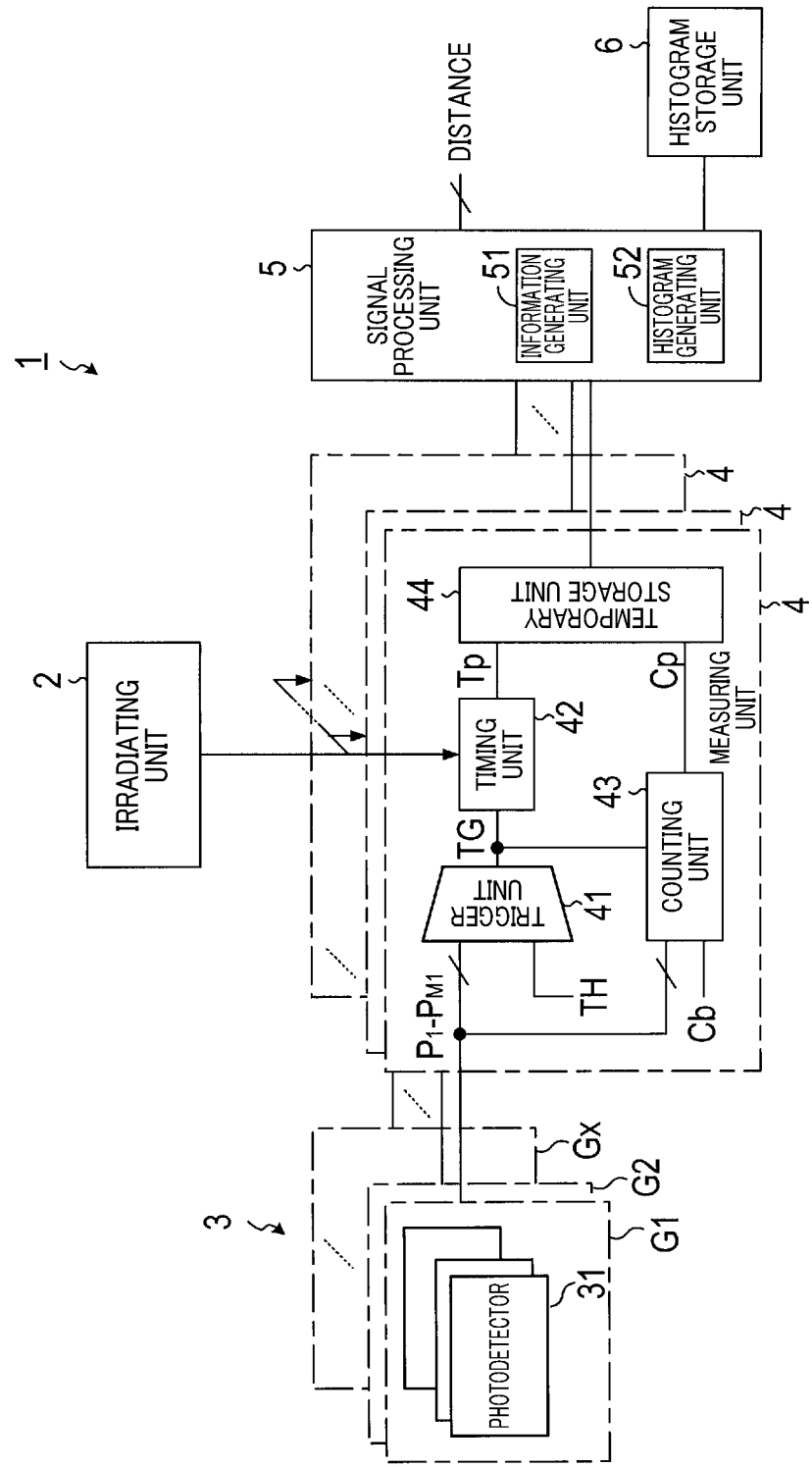
FIG. 1 is a block diagram showing the configuration of a laser radar of a first embodiment.

JP 2014-81254 A describes a technique of measuring a time of flight (hereinafter, abbreviated to TOF) of light from irradiation to light reception on the assumption that the number of responses detected by a photodetector after irradiation of light is a trigger threshold value or larger and determining a distance to an object which has reflected light from the measured TOF. In order to remove the influence of disturbance light incident on the SPAD array, or the like, the measurement of TOF is repeatedly made to generate a histogram of the integrated number of responses at each measurement time, and the time obtained from a maximum value on the histogram is used for calculation of the distance.

However, as a result of detailed reviews by the inventor, the following problems have been found in the prior art described in JP 2014-81254 A.

Specifically, in the prior art, when the number of the SPADs included in the SPAD array is increased in order to improve the detection performance, the number of responses in the photodetector increases, and the processing load of a rear-stage timing circuit for measuring the TOF increases accordingly. If the processing load exceeds the processing ability of the timing circuit, the detection performance would be reduced conversely.

In order to prevent this, the number of responses may be suppressed from increasing by reducing the sensitivity of the SPADs. In this case, however, it becomes impossible to detect weak reflected light from a long distance or reflected light from an object with low reflectivity.

One aspect of the present disclosure is to provide a technique capable of reducing the processing of a timing circuit without deteriorating the detection sensitivity.

A photodetection device, which is one embodiment of the present disclosure, includes a light receiving array unit, a plurality of the measuring units and a signal processing unit.

The light receiving array unit is configured in such a manner that a plurality of photodetectors each outputting a pulse signal in response to incidence of a photon form a light receiving group and that a plurality of light receiving groups form one pixel. The light receiving array unit is provided with one or more of such pixels.

The measuring unit is provided for each of the plurality of light receiving groups. The measuring unit generates time information representing an elapsed time from an irradiation timing input from outside and light quantity information acquired at each of one or more timings identified from the time information, in accordance with the pulse signal output from the light receiving group. It should be noted that the number of the photodetectors outputting the pulse signal among the plurality of photodetectors belonging to the light receiving group is used as the light quantity information.

The signal processing unit determines a time of flight of light in accordance with at least one of the time information and the light quantity information measured at the plurality of measuring units corresponding to the one pixel.

Such a configuration can suppress the number of pulse signals to be processed by the individual measuring units from increasing, without reducing the sensitivity of the photodetector.

Hereinafter, embodiments of the present disclosure will be described with reference to the drawings.

1. First Embodiment 1-1. Configuration

A laser radar 1 of this embodiment is mounted in a vehicle to detect various objects existing around the vehicle and to generate information regarding the objects. The laser radar 1 includes an irradiating unit 2, a light receiving array unit 3, a plurality of measuring units 4, a signal processing unit 5 and a histogram storage unit 6, as shown in FIG. 1. It should be noted that the configuration in which the irradiating unit 2 is excluded from the laser radar 1 corresponds to an optical measuring device.

The irradiating unit 2 gives repeated irradiation with pulse-shaped laser light at preset intervals and notifies each of the plurality of measuring units 4 of the irradiation timing. Hereinafter, the cycle of laser light irradiation is referred to as measurement cycle.

The light receiving array unit 3 has a plurality of light receiving groups G1 to Gx. The symbol "x" represents an integer of 2 or more. Each light receiving group Gi includes Mi photodetectors 31. The symbol "i" represents any value of 1 to x. The individual photodetectors 31 include SPADs.

SPAD is an abbreviation for Single Photon Avalanche Diode. SPAD is an avalanche diode which operates in a Geiger mode in which voltage higher than the breakdown voltage is applied as reverse bias voltage, and which can detect the incidence of a single photon. The light receiving array unit 3 includes a total of M1+M2+ . . . Mx SPADs. These SPADs are arranged to form a two-dimensional matrix and form a light receiving surface. Here, SPADs for a plurality of rows, in the matrix of SPADs, are assigned to each of the light receiving groups G1 to Gx.

Upon incidence of a photon on the SPADs, a light receiving circuit outputs a pulse signal P having a preset pulse width. Hereinafter, the respective pulse signals output by the Mi photodetectors 31 included in the light receiving group Gi are expressed as $P_1$ to $P_{Mi}$.

The individual photodetectors 31 include a SPAD 81, a quench resistor 82, an inversion circuit 83, a D flip-flop circuit (hereinafter, DFF circuit) 84 and a delay circuit 85, as shown in FIG. 10. The SPAD 81 has an anode connected to a negative power supply and a cathode connected to a positive power supply via the quench resistor 82. The quench resistor 82 applies reverse bias voltage to the SPAD 81. In addition, the quench resistor 82 stops Geiger discharge of the SPAD 81 caused by voltage drop caused by the current flowing through the SPAD 81 when the incidence of a photon on the SPAD 81 causes breakdown of the SPAD 81, when a photon is incident on the SPAD 81 to cause breakdown of the SPAD 81. A resistance element having a predetermined resistance value, a MOSFET whose ON-resistance can be set by gate voltage, or the like is used as the quench resistor 82.

The inversion circuit 83 is connected to the cathode of the SPAD 81. When the SPAD 81 is in a non-breakdown state, the input of the inversion circuit 83 is at the high level. When the SPAD 81 is in a breakdown state, a current flows through the quench resistor 82 so that the input of the inversion circuit 83 changes to the low level. The output of the DFF circuit 84 changes to the high level at a rising edge where the output of the inversion circuit 83 changes from the low level to the high level. The output of the DFF circuit 84 is connected to a reset terminal of the DFF circuit 84 via the delay circuit 85. The delay circuit 85 inverts the signal level of the output of the DFF circuit 84, delays the output thereof by a preset delay time τ, and inputs it to the reset terminal. Thus, the DFF circuit 84 is reset after an elapse of the delay time τ from the change of the output of the DFF circuit 84 to the high level, so that the output of the DFF circuit 84 changes to the low level.

The number of the plurality of measuring units 4 is x which is equal to the number of the light receiving groups G1 to Gx. The respective measuring units 4 are associated with any of the light receiving groups G1 to Gx on a one-to-one basis. Since the plurality of measuring units 4 are all configured similarly, the one measuring unit 4 associated with the light receiving group Gi will be described below.

The measuring unit 4 generates time information Tp representing TOF, which is a time of flight of light required from irradiation to light reception and light quantity information Cp representing the amount of light at the time of light reception, based on the pulse signals $P_1$ to $P_{Mi}$ output in parallel from the light receiving group Gi and the irradiation timing supplied from the irradiating unit 2. TOF is an abbreviation for Time Of Flight. The measuring unit 4 includes a trigger unit 41, a timing unit 42, a counting unit 43 and a temporary storage unit 44.

The trigger unit 41 outputs a trigger signal TG with a predetermined pulse width which represents a light receiving timing when the number of the pulse signals $P_1$ to $P_{Mi}$ output simultaneously from the light receiving group Gi, i.e., the number of the photodetectors 31 each output the pulse signal in response to a photon, is a trigger threshold value TH or larger. When the light receiving group Gi receives reflected waves from a plurality of objects positioned at different distances, the trigger unit 41 outputs a plurality of the trigger signals TG. The trigger threshold value TH may be a fixed value or a variable value which changes depending on the situation.

The timing unit 42 is a so-called TDC, and measures a time from the irradiation timing notified from the irradiating unit 2 to the light receiving timing represented by the trigger signal TG and outputs the measured time as the time information Tp. TDC is an abbreviation for Time to Digital Converter. The TDC is constituted by a digital circuit as a whole.

The counting unit 43 counts the number Cx of responses, which is the number of the pulse signals $P_1$ to $P_{Mi}$ output simultaneously from the light receiving group Gi, at a timing according to the trigger signal TG and outputs the adjusted number of responses, which is a result of subtraction of a bias value Cb from the number Cx of responses, as the light quantity information Cp representing the intensity of the received light. The timing according to the trigger signal TG may be a timing at which the trigger signal TG is output or a timing delayed by a predetermined delay amount. The bias value Cb may be a fixed value or a variable value which changes depending on the situation. When the bias value Cb is a fixed value, it may be 0. When the bias value Cb is a variable value, it may be set in conjunction with the trigger threshold value TH or set according to either or both of the ambient brightness and the free space on the histogram storage unit 6.

The temporary storage unit 44 has a freely readable/writable memory RAM. In the temporary storage unit 44, the light quantity information Cp generated at the counting unit 43 is stored at the address associated with the time information Tp generated at the timing unit 42, as shown in FIG. 2. The time information Tp is a value expressed in units of time areas (hereinafter referred to time bins) divided based on the time resolution of the timing unit 42. Hence, a larger address means a longer TOF and therefore a longer distance to the object. As the bit width of the data stored in the temporary storage unit 44, the minimum size capable of expressing the number Mi of the SPADs included in the light receiving group Gi is sufficient.

Figure 3:
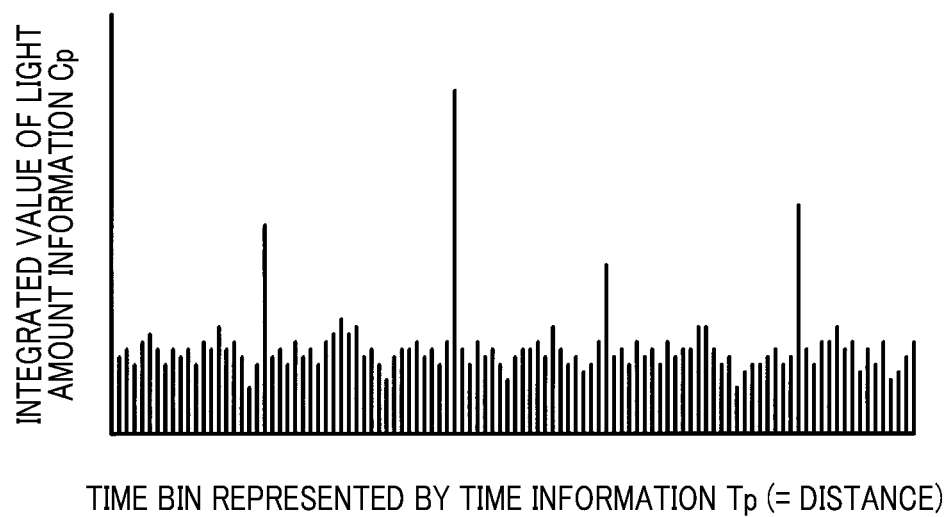
FIG. 3 is an explanatory view concerning a histogram.

The histogram storage unit 6 has a freely readable/writable memory RAM. The address of the histogram storage unit 6 is associated with the time information Tp, similarly to the temporary storage unit 44, as shown in FIG. 3. The bit width of the data stored in the histogram storage unit 6 is appropriately set, in order that the integrated value would not overflow, according to an expected value of the number of responses detected in single measurement, the frequency X of integration which is the number of repetitions of integration when the signal processing unit 5 generates a histogram, or the like. The frequency X of integration may be 1 or more.

The signal processing unit 5 includes an information generating unit 51 and a histogram generating unit 52.

The information generating unit 51 operates at each of X measurement cycles, i.e., each time when a histogram is generated, to generate information regarding an object which has reflected light based on the histogram generated by the histogram generating unit 52. Specifically, it extracts maximum values on the histogram as luminances and identifies, for each of the extracted maximum values, the time corresponding to the address at which the maximum value is obtained. Further, object information including, for example, the distance to each object which is a cause of generation of the maximum value on the histogram and the reliability of the object is generated, based on a combination of these extracted luminances and the time bins (i.e., TOF). The generated object information is provided to various vehicle-mounted devices which utilize the object information via a vehicle-mounted LAN not shown.

The histogram generating unit 52 operates at each measuring cycle to update the details of the histogram stored in the histogram generating unit 6 in accordance with the information stored in each of the temporary storage units 44 possessed by each of the plurality of measuring units 4.

Figure 4:
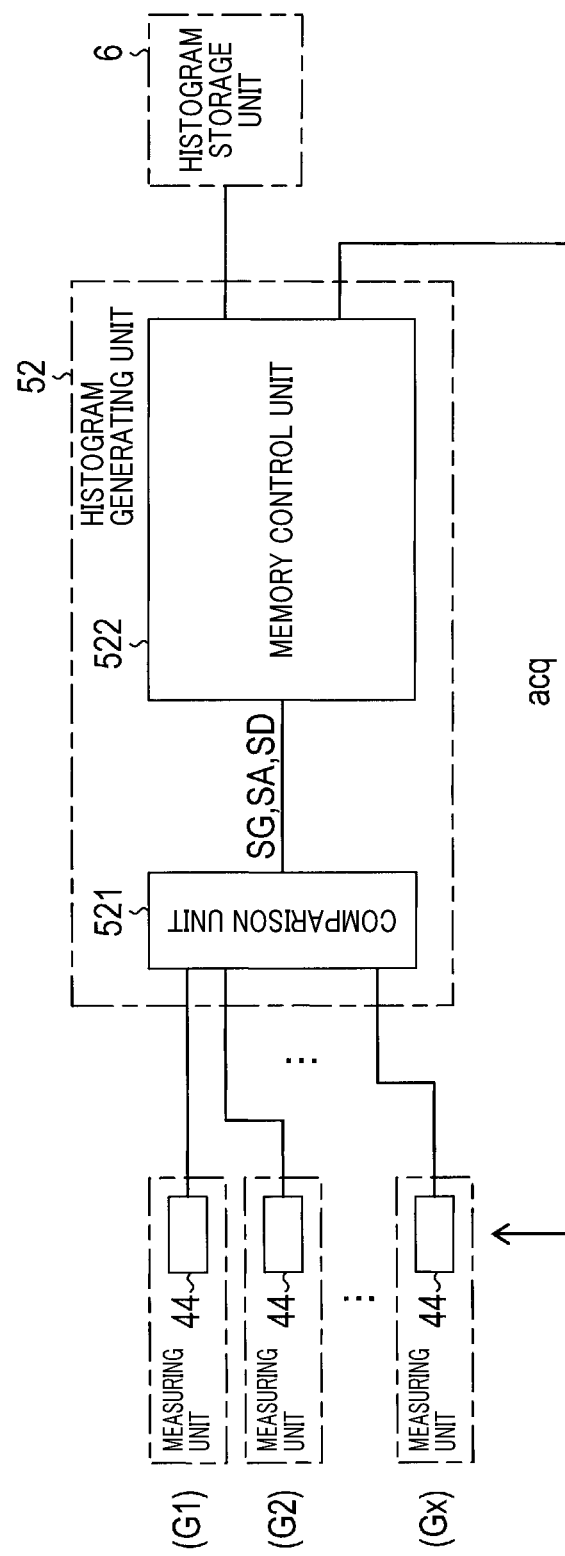
FIG. 4 is a block diagram showing the configuration of a histogram generating unit.

The histogram generating unit 52 includes a comparison unit 521 and a memory control unit 522, as shown in FIG. 4. The temporary storage unit 44 is configured to output the smallest address among the addresses at which data is written and the data stored at the address, in an initial state. In addition, the temporary storage unit 44 is configured to sequentially output the second smallest address among the addresses at which data is written and the data stored at the address, in accordance with an update instruction acq from the memory control unit 522.

The comparison unit 521 compares the inputs from the plurality of temporary storage units 44, selects the light receiving group G outputting the smallest address, and supplies the selected light receiving group (hereinafter, selected group) SG, the address (hereinafter, selected address) SA input from the temporary storage unit 44 of the selected group and data (hereinafter, selected data) to the memory control unit 52. It should be noted that, when there are a plurality of light receiving groups G outputting the smallest address, only one light receiving group with the smallest identifier for identifying the light receiving group, among the plurality of light receiving groups G, is defined as the selected group SG. Without limitation to this, all the plurality of light receiving groups may be defined as selected groups SG1, SG2 . . . . In this case, the selected data SD may be a total value of all the data input from the selected groups SG1, SG2 . . . .

The memory control unit 522 updates the value of the histogram stored in the histogram storage unit 6 using the selected address SA and selected data SD supplied from the comparison unit 521. Specifically, the data at the selected address SA is read out from the histogram storage unit 6, the selected data SD is added to the read-out data, which is written at the selected address SA. In addition, the memory control unit 522 outputs the update instruction acq in which the selected group SG is designated to the temporary storage unit 44 to update the output of the temporary storage unit 44 belonging to the selected group SG.

It should be noted that each function of the signal processing unit 5 is realized by a hardware electronic circuit. The electronic circuit may be realized by a digital circuit or an analog circuit, or a combination thereof. Some of these functions may be realized by processing executed by a CPU.

1-2. Operation

Figure 5:
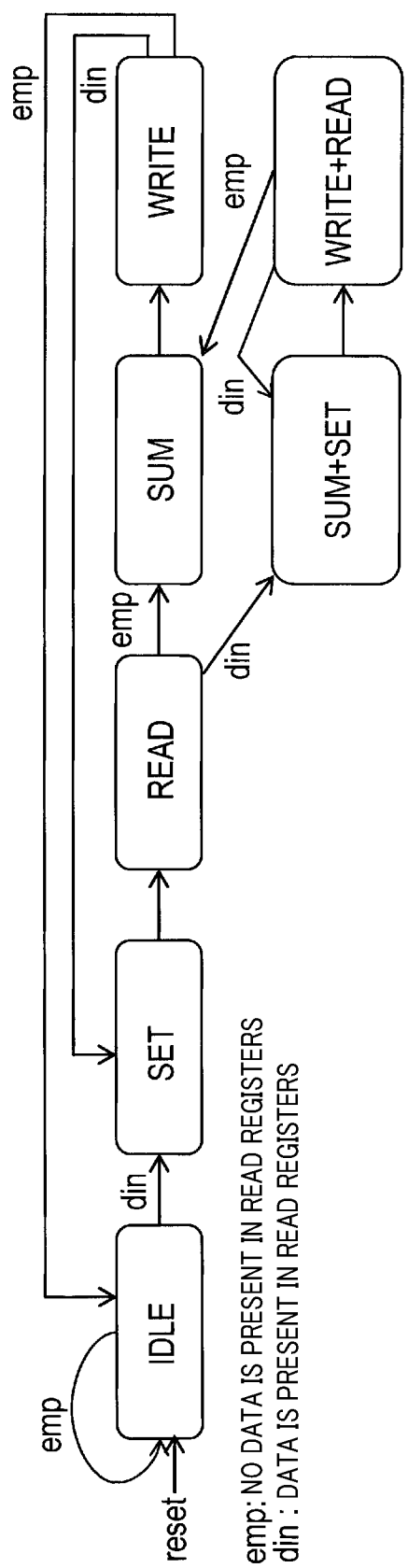
FIG. 5 is a state machine view explaining the operation of the histogram generating unit.

Here, the overall operation of the histogram generating unit 52 will be described with reference to the state machine view in FIG. 5. The histogram generating unit 52 has an IDLE state, a SET state, a READ state, a SUM state and a WRITE state, and appropriately shifts among these states and executes operations in accordance with the respective states. However, the SUM state and the SET state, and the WRITE state and the READ state, respectively, can coexist depending on the situation. The symbol "emp" in this figure means that no data is present in any of the plurality of temporary storage units 44 (hereinafter, read registers), and the symbol "din" means that data is present in the read registers.

The histogram generating unit 52 is reset each time when the information generating unit 51 executes information generation processing using the histogram. When the signal processing unit 5 is reset, the histogram generating unit 52 is brought into the IDLE state. At this time, the histogram stored in the histogram storage unit 6 is also reset.

The IDLE state is a state in which the histogram generating unit 52 is waiting for writing of data in the read registers. In the IDLE state, when data is written in the read registers, the read registers are in the din state, and the histogram generating unit 52 shifts to the SET state.

In the SET state, the comparison unit 521 outputs the selected group SG, the selected address SA and the selected data SD to the memory control unit 522. Thereafter, the histogram generating unit 52 shifts to the READ state.

In the READ state, the memory control unit 522 reads the data at the selected address SA from the histogram storage unit 6. If the read registers are in the emp state at this time, the histogram generating unit 52 shifts to the SUM state.

In the SUM state, the memory control unit 522 generates an integrated value in which the selected data is added to the data read out at the time of the READ state. Then, the histogram generating unit 52 shifts to the WRITE state.

In the WRITE state, the memory control unit 522 writes the integrated value generated at the time of the SUM state at the selected address SA of the histogram storage unit 6 and outputs the update instruction acq in which the selected group SG is designated to the read registers. As a result of update of the situation of the read registers by the update instruction acq, if the read registers are in the emp state, the histogram generating unit 52 shifts to the IDLE state. On the other hand, if the read registers are in the din state, the histogram generating unit 52 shifts to the SET state.

If the read registers are in the din state in the previous READ state, the histogram generating unit 52 shifts to the SUM+SET state.

In the SUM+SET state, the operation in the SUM state by the memory control unit 522 and the operation in the SET state by the comparison unit 521 are executed in parallel. Thereafter, the histogram generating unit 52 shifts to the WRITE+READ state.

In the WRITE+READ state, the operation in the WRITE state and operation in the READ state by the memory control unit 522 are executed in parallel. Thereafter, the histogram generating unit 52 shifts to the SUM+SET state if the situation of the read registers is din, and shifts to the SUM state if the state of the read registers is emp.

1-3. Effects

The first embodiment described in detail above provides the following effects.

(1a) In the laser radar 1, many photodetectors 31 constituting one pixel are divided into a plurality of light receiving groups G1 to Gx and dispersed in a plurality of measuring units 4 provided for each of the light receiving groups G1 to Gx to execute the processing of a pulse signal P, and unify the processing results to generate a histogram. Thus, the laser radar 1 enables reduction in processing load of the individual measuring units 4 without reducing the sensitivity of the photodetectors 31, i.e., without deteriorating the detection performance. Namely, in conventional devices in which one measuring unit is provided in one pixel, the measuring unit must execute the processing for all the pulse signals indicated in a graph formed by adding all the graphs in FIG. 2. On the other hand, in the laser radar 1 having a plurality of measuring units 4 in one pixel, it suffices that the measuring units 4 each execute processing only for the pulse signals indicated in any one of the graphs in FIG. 2, and the processing load is reduced.

(1b) In the laser radar 1, the measuring units 4 are each provided with the temporary storage unit 44 which stores the time information Tp and the light quantity information Cp which are measurement results. Accordingly, the signal processing unit 5 does not have to perform real-time processing at the timing of generation of the pulse signal P and can execute processing utilizing the time until next light emission, and thus can utilize the measurement results without omission.

2. Second Embodiment

2.1. Difference from First Embodiment

Since a second embodiment is similar to the first embodiment in basic configuration, a difference will be described below. The same reference signs as in the first embodiment represent the same components, and the preceding explanations are referred to.

In the first embodiment described above, the light receiving groups G1 to Gx and the plurality of measuring units 4 are associated on a one-to-one basis. On the other hand, the second embodiment is different from the first embodiment in that the association between them can be appropriately changed.

Figure 6:
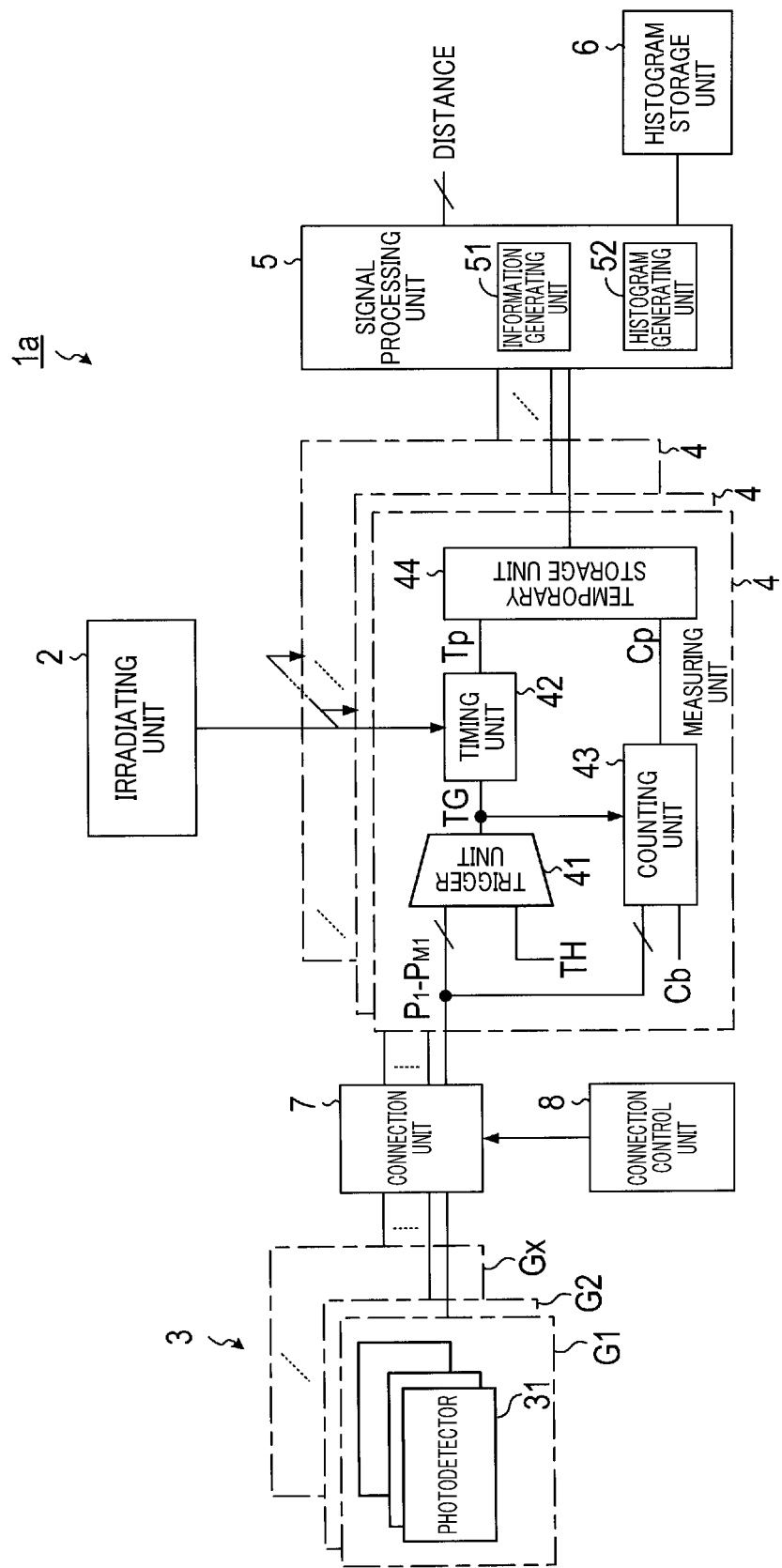
FIG. 6 is a block diagram showing the configuration of a laser radar of a second embodiment.

As shown in FIG. 6, a laser radar 1a of this embodiment includes a connection unit 7 and a connection control unit 8 in addition to the components of the laser radar 1 according to the first embodiment. However, the number of the measuring units 4 is set to the number x of the light receiving groups G1 to Gx or smaller. Hereinafter, explanation will be given on the assumption that the number of the measuring units 4 is 2. Further, the connection unit 7 corresponds to a front-positioned connection unit, and the connection control unit 8 corresponds to a front-positioned control unit.

The connection unit 7 assigns the light receiving groups G1 to Gx to the two measuring units 4, respectively, in accordance with an instruction from the connection control unit 8. Specifically, one pixel is divided into upper and lower two areas, the first measuring unit 4 processes pulse signals P from the light receiving groups belonging to the upper area, and the second measuring unit 4 processes pulse signals P from the light receiving groups belonging to the lower area. Briefly, the connection unit 7 appropriately changes the organization of the light receiving groups for which each of the measuring units 4 is in charge of processing.

The connection control unit 8 acquires situation information representing a situation in which the laser radar 1a is used, and changes the setting of the connection unit 7, i.e., the boundary between the upper area and the lower area of the pixel, in accordance with the acquired situation information.

Here, the connection control unit 8 acquires information, for example, from a sensor which monitors the intensity of disturbance light incident on the light receiving array unit 3, as the situation information. The connection control unit 8 may decrease the number m of the light receiving groups belonging to the upper area and increase the number n of the light receiving groups belonging to the lower area as disturbance light is stronger, in accordance with the situation information, as shown in the upper column of FIG. 7.

Specifically, when disturbance light is strong, the brightness of the target to be measured tends to easily form a gradation changing from light to dark from the upper toward the lower regions. The load of the measuring unit 4 which processes the upper area is reduced by decreasing the number of the SPADs in the upper area on which strong disturbance light is incident. This upper-lower relationship may be inverted depending on the lens.

In addition, the connection control unit 8 may acquire information, for example, from a sensor which monitors the situation of a road surface as the situation information. In this case, in the case where the connection control unit 8 detects a snow road from the situation information, the connection control unit 8 may increase the number m of the light receiving groups belonging to the upper area and decrease the number n of the light receiving groups belonging to the lower area, as shown in the lower column of FIG. 7.

Namely, since road surface reflection becomes strong in the case of the snow road, the brightness of the target to be measured tends to easily form a gradation changing from dark to light from the upper toward the lower. The load of the measuring unit 4 which processes the lower area is reduced by decreasing the number of the SPADs in the lower area with strong road surface reflection. This upper-lower relationship may be inverted depending on the lens.

2-2. Effects

The second embodiment described in detail above provides the effects (1a) and (1b) of the first embodiment described above and further provides the following effect.

(2a) According to the laser radar 1a, the number of the light receiving groups to be assigned to each of the measuring units 4 is changed depending on the situation, thereby making it possible to further suppress each of the measuring units 4 from being overload.

3. Third Embodiment

3-1. Difference from First embodiment

Since a third embodiment is similar to the first embodiment in basic configuration, a difference will be described below. The same reference signs as in the first embodiment represent the same components, and the preceding explanations are referred to.

In the first embodiment described above, the measurement results obtained at the plurality of measuring units 4 are processed by the one signal processing unit 5. On the other hand, the third embodiment is different from the first embodiment in that a plurality of signal processing units 5 are provided, and, besides, the association thereof with the measuring units 4 can be appropriately changed.

Figure 8:
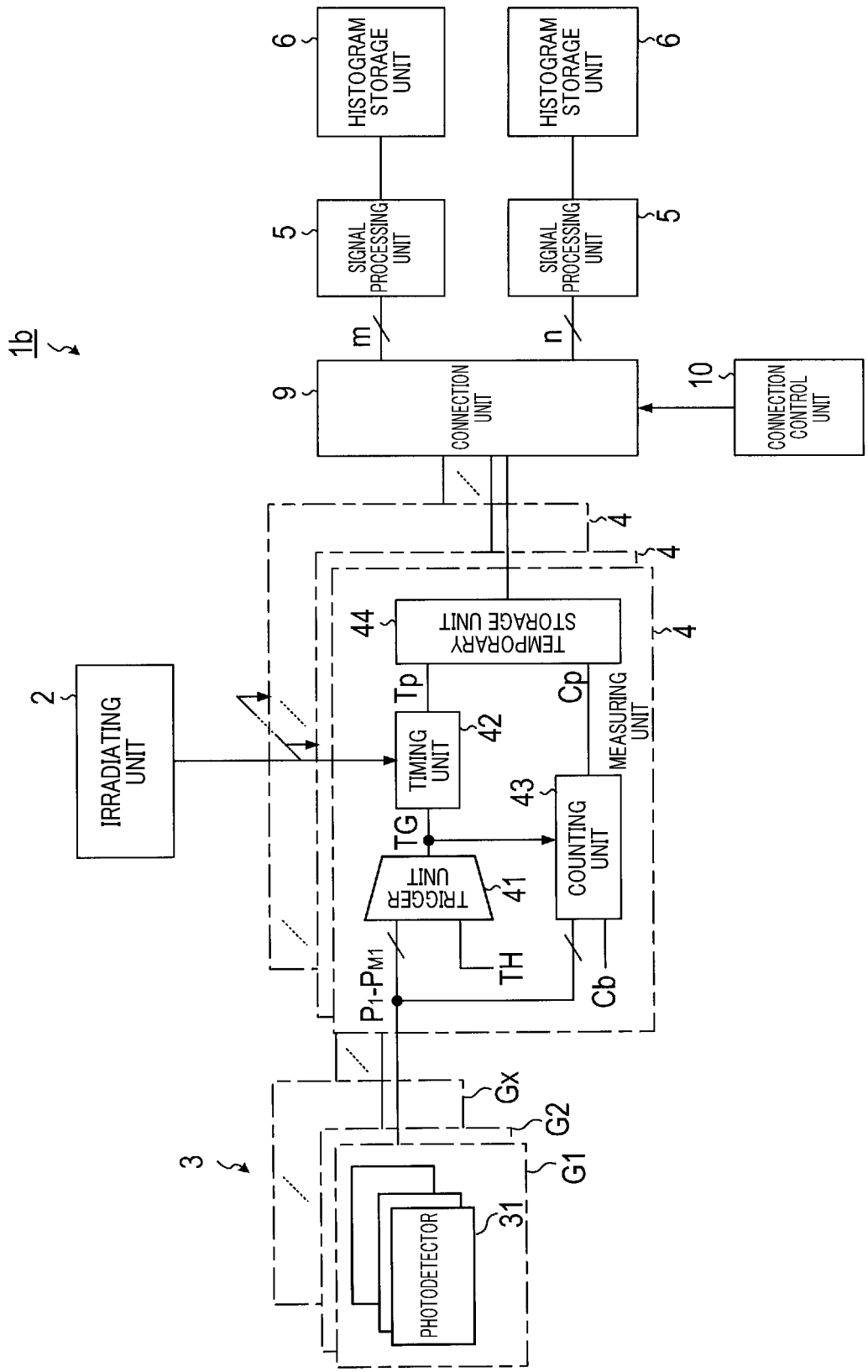
FIG. 8 is a block diagram showing the configuration of a laser radar of a third embodiment.

As shown in FIG. 8, a laser radar 1b of this embodiment includes a connection unit 9 and a connection control unit 10 in addition to the components of the laser radar 1 according to the first embodiment. Further, the laser radar 1b includes two signal processing units 5 and two histogram storage units 6. The number of each of the signal processing units 5 and the histogram storage units 6 may be 3 or more. The connection unit 9 corresponds to a rear-positioned connection unit, and the connection control unit 10 corresponds to a rear-positioned control unit.

The connection unit 9 assigns the measuring units 4 and therefore the light receiving groups G1 to Gx to the two signal processing units 5, respectively, in accordance with an instruction from the connection control unit 10. Specifically, one pixel is divided into upper and lower two areas, and the first signal processing unit 5 generates a histogram based on the measurement results obtained at the plurality of measuring units 4 which process the pulse signals P from the light receiving groups belonging to the upper area. In addition, the second signal processing unit 5 generates a histogram based on the measurement results obtained at the plurality of measuring units 4 which process the pulse signals P from the light receiving groups belonging to the lower area.

The connection control unit 10 acquires situation information representing a situation in which the laser radar 1b is used, and changes the setting of the connection unit 9, i.e., the boundary between the upper area and the lower area of the pixel, in accordance with the acquired situation information.

Here, the connection control unit 10 acquires information, for example, from a sensor which monitors the posture of the vehicle as the situation information. In this embodiment, the laser radar 1b is set to irradiate the road surface with laser light. The connection control unit 10 basically sets the number m of the light receiving groups belonging to the upper area to be large and the number n of the light receiving groups belonging to the lower area to be small, as shown in FIG. 9, and changes the proportions of m and n in accordance with the posture of the vehicle.

Namely, when the road surface is irradiated with laser light, reflected waves from a more distant place is detected in the upper area, and reflected waves from a nearer place is detected in the lower area. This upper-lower relationship may be inverted depending on the lens. The number m of the light receiving groups to be assigned to the upper area is increased, so that weak signals from a long distance can be detected though the resolution becomes coarser. In addition, the number n of the light receiving groups to be assigned to the lower area is decreased, so that the resolution can be enhanced at the sacrifice of detection of weak signals. It is also possible to estimate the distance to the road surface at which laser light arrives for each light receiving group from the posture of the vehicle and to change the proportions of the numbers m and n according to the estimated distance.

3-2. Effects

The third embodiment described in detail above provides the effects (1a) and (1b) of the first embodiment described above and further provides the following effect.

(3a) The laser radar 1b can appropriately change the sizes of the areas for generating the histograms and therefore the detection accuracy depending on the situation.

4. Fourth Embodiment

4-1. Difference from First Embodiment

Since a fourth embodiment is similar to the first embodiment in basic configuration, a difference will be described below. The same reference signs as in the first embodiment represent the same components, and the preceding explanations are referred to.

In the first embodiment described above, the trigger signal RG is generated, and the histogram is updated using only the light quantity information Cp determined at the timing of the trigger signal TG. On the other hand, the fourth embodiment is different from the first embodiment in that the light quantity information Cp is repeatedly generated in synchronization with a clock, and the histogram is updated using all the light quantity information Cp.

Figure 11:
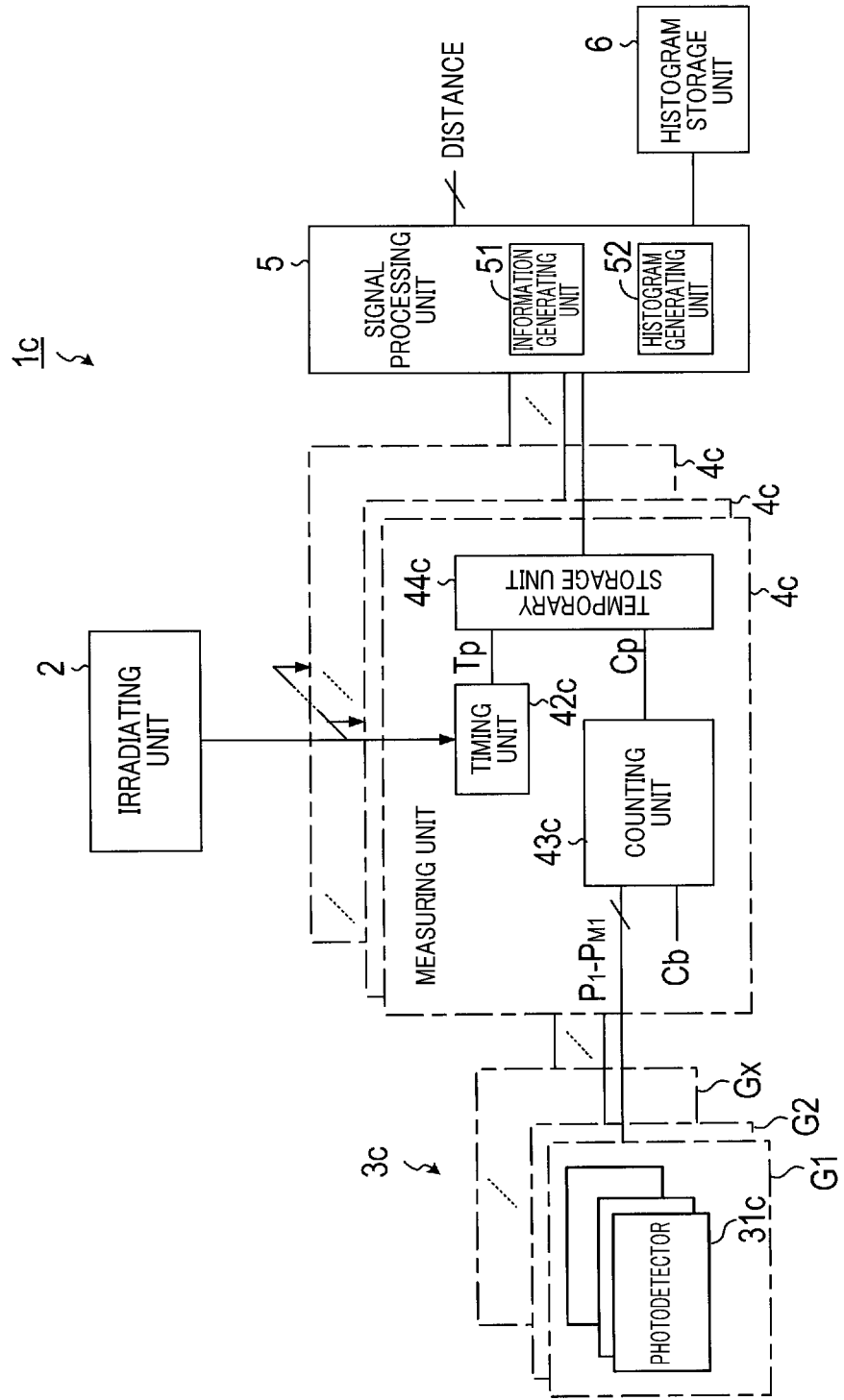
FIG. 11 is a block diagram showing the configuration of a laser radar of a fourth embodiment.

A laser radar 1c of this embodiment includes an irradiating unit 2, a light receiving array unit 3c, a plurality of measuring units 4c, a signal processing unit 5 and a histogram storage unit 6, as shown in FIG. 11.

The light receiving array unit 3c has a plurality of light receiving groups G1 to Gx. Each light receiving groups Gi has Mi photodetectors 31c. This embodiment is similar to the first embodiment in that each of the M1+M2+ . . . +Mx photodetectors 31c has SPADs, and that these SPADs are arranged to form a two-dimensional matrix, and form a light receiving surface.

Figure 12:
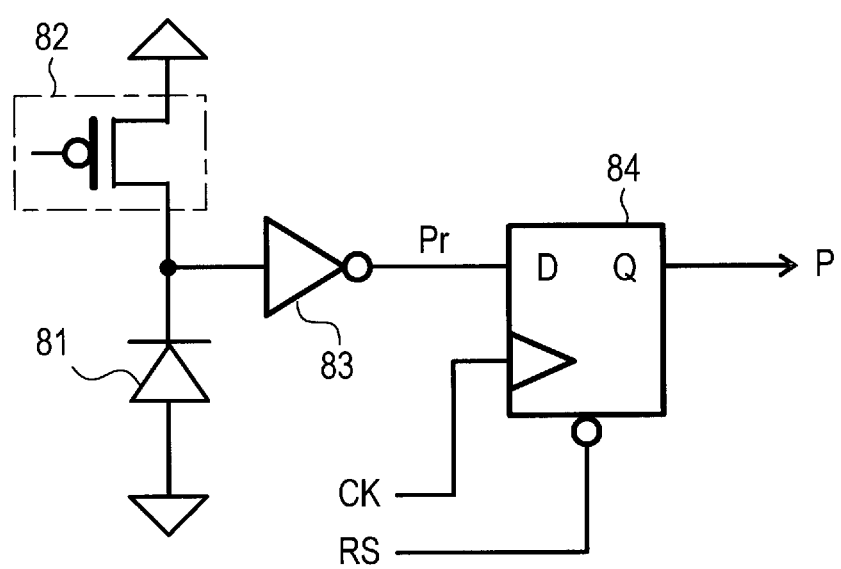
FIG. 12 is a circuit diagram showing the configuration of a photodetector of the fourth embodiment.

The individual photodetectors 31c include a SPAD 81, a quench resistor 82, an inversion circuit 83 and a DFF circuit 84, as shown in FIG. 12. Namely, the photodetectors 31c are different from the photodetectors 31 of the first embodiment in terms of the absence of the delay circuit 85 and the connection state of the DFF circuit 84.

The DFF circuit 84 latches the output of the inversion circuit 83 at a timing of a rising edge of a clock CK and outputs this as a pulse signal P. In addition, the output of the DFF circuit 84 is reset by a reset signal RS.

Namely, upon incidence of a photon on the SPAD 81, the photodetectors 31c outputs the pulse signal P in response to this. At this time, the pulse width of a pulse signal Pr output by the inversion circuit 83 continues until the Geiger discharge of the SPAD 81 is stopped by voltage drop caused by the current flowing through the quench resistor 82. This pulse signal Pr is converted to the pulse signal P synchronized with the clock CK by the DFF circuit 84. Briefly, the pulse width of the pulse signal P output by the DFF circuit 84 includes a deviation for the quantization error caused by the clock CK.

Returning to FIG. 11, the measuring units 4c each include a timing unit 42c, a counting unit 43c and a temporary storage unit 44c.

The timing unit 42c has a synchronous counter which operates in accordance with the clock CK. The timing unit 42c starts counting based on the irradiation timing notified from the irradiating unit 2, and continues the counting operation during at least the time necessary for the light signal to travel the maximum detection distance and back. The timing unit 42c outputs the count value of the synchronous counter as the timing unit Tp. Namely, the time information Tp changes in synchronization with the clock CK and represents an elapsed time from the irradiation timing.

The counting unit 43c always determines the number Cx of responses, which is the number of the pulse signals $P_1$ to $P_{M1}$ output simultaneously from the photodetectors 31c, using an encoder or the like. Further, the counting unit 43c repeatedly calculates the adjusted number of responses which is a result of subtraction of the bias value Cb from the number Cx of responses at each timing of the clock CK, i.e., each time when the time information Tp changes, and outputs the calculation result as the light quantity information Cp representing the luminance of the received light signal. Briefly, the light quantity information Cp changes in synchronization with the clock CK, similarly to the time information Tp.

The temporary storage unit 44c is similar to the temporary storage unit 44 except that the light quantity information Cp is stored at the timing of the clock CK in place of the trigger signal TG. Thus, in the temporary storage unit 44c, the light quantity information Cp is stored in all the time bins identified by the time information Tp.

4-2. Effects

The fourth embodiment described in detail above provides the effects (1a) and (1b) of the first embodiment described above and further provides the following effect.

(4a) According to the laser radar 1c, since the time information Tp and the light quantity information Cp are always generated at the timing synchronized with the clock CK, it is unnecessary to generate the trigger signal TG, so that the trigger unit 41 can be omitted. Therefore, the device configuration can be simplified.

5. Other Embodiments

The embodiments of the present disclosure have been described above, but the present disclosure is not limited to the above-described embodiments, and can be implemented with various modifications.

(5a) In the above embodiments, the light receiving groups are constituted in units of rows in the two-dimensional matrix of SPADs. However, the present disclosure is not limited to this. For example, the light receiving groups may be constituted in units of columns in the two-dimensional matrix of SPADs, or constituted in units of masses having any shape.

(5b) In the second embodiment described above, the connection unit 7 switches the connection in units of the light receiving groups. However, the present disclosure is not limited to this. For example, the connection unit 7 may be configured to switch the connection in units of the individual photodetectors 31.

(5c) In the second embodiment described above, the connection control unit 8 changes the boundary between the upper area and the lower area of the pixel based on the situation information. However, the present disclosure is not limited to this. The target to be changed based on the situation information may include, for example, at least one of the number of the photodetectors forming the light receiving groups, the size of the pixel formed by the light receiving groups and the shape of the pixel.

(5d) In the third embodiment described above, the plurality of signal processing units 5 each process a partial area in one pixel to generate a plurality of histograms for one pixel. However, the present disclosure is not limited to this. For example, the plurality of signal processing units 5 may be each configured to generate a histogram for one pixel, and the connection unit 9 may be configured to switch the light receiving groups G1 to Gx associated with the respective pixels to appropriately change at least one of the size of each of the pixels, the shape of each of the pixels and the number of the photodetectors included in each of the pixels.

(5e) In the third embodiment described above, on the premise that the area in the pixel corresponding to each of the signal processing units 5 or the pixel corresponding to each of the signal processing units 5 is referred to area or the like, the connection control unit 10 may be configured to change the connection by the connection unit 9 so that the pixels are identical in the number of the photodetectors 31 forming each of the areas or the like, or the size or the shape of each of the areas or the like. In addition, the connection control unit 10 may be configured to change the connection by the connection unit 9 so that the pixels are different in at least one of the number of the photodetectors 31 forming each of the areas or the like, and the size and the shape of each of the areas or the like.

(5f) In the second and third embodiments described above, the number of connections is changed based on the situation information acquired by the connection control units 8, 10. However, the present disclosure is not limited to this. For example, the number of connections may be set in advance based on the properties (for example, angle of view and distortion) of the light receiving lens and the light irradiation range of the irradiating unit 2.

(5g) In the second and third embodiments described above, the intensity of disturbance light, the road surface situation and the posture of the vehicle are used as the situation information acquired by the connection control unit 8 or 10. However, the present disclosure is not limited to this. For example, various pieces of information correlated with disturbance light, such as time or weather, may be used as the situation information. In addition, various pieces of information correlated with the posture of the vehicle, such as the acceleration of the vehicle or a map showing the inclination angle of the road, may be used as the situation information. Further, past situation information or the like may be used as the situation information.

(5h) In the second and third embodiments described above, the connection unit 7 or 9 is provided on either one of the input sides or the output sides of the plurality of measuring units 4. However, the connection units 7, 9 may be provided at the same time.

(5i) In the above embodiments, the RAM used as the temporary storage unit 44 includes an address associated with the time information Tp. However, the present disclosure is not limited to this. For example, the time information Tp and the light quantity information Cp may be associated with each other and both stored as data in the RAM used as the temporary storage unit 44. By virtue of this, it is not necessary for the RAM used as the temporary storage unit 44 to prepare addresses for all the time bins. So, especially when the pulse signal frequency from the light receiving groups is low, the capacity of the RAM can be reduced. In addition, in this case, the histogram generating unit 52 may be configured to compare pieces of the time information Tp themselves in place of comparison of the addresses.

Figure 13:
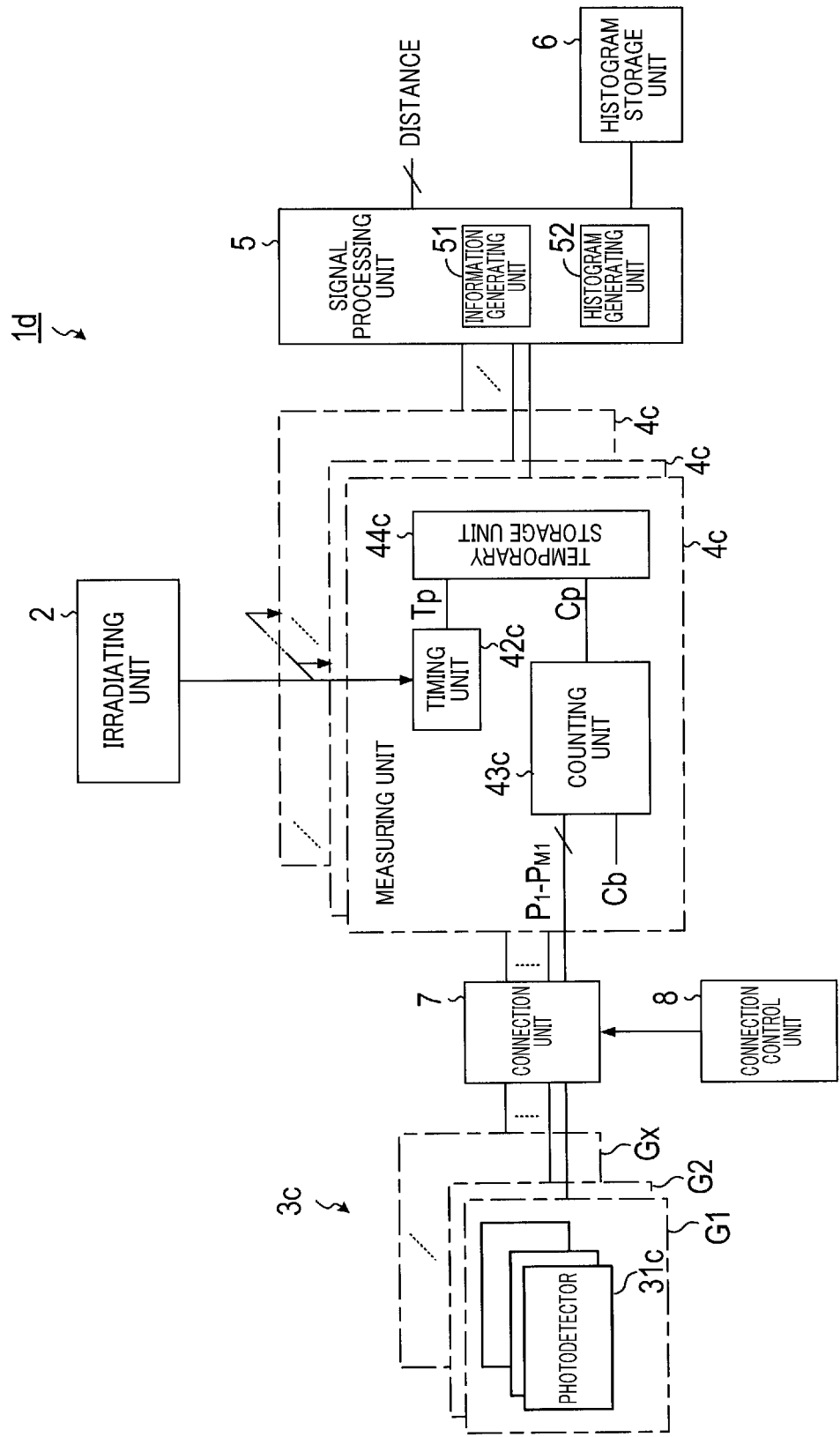
FIG. 13 is a block diagram showing the configuration of a variation of the second embodiment.
Figure 14:
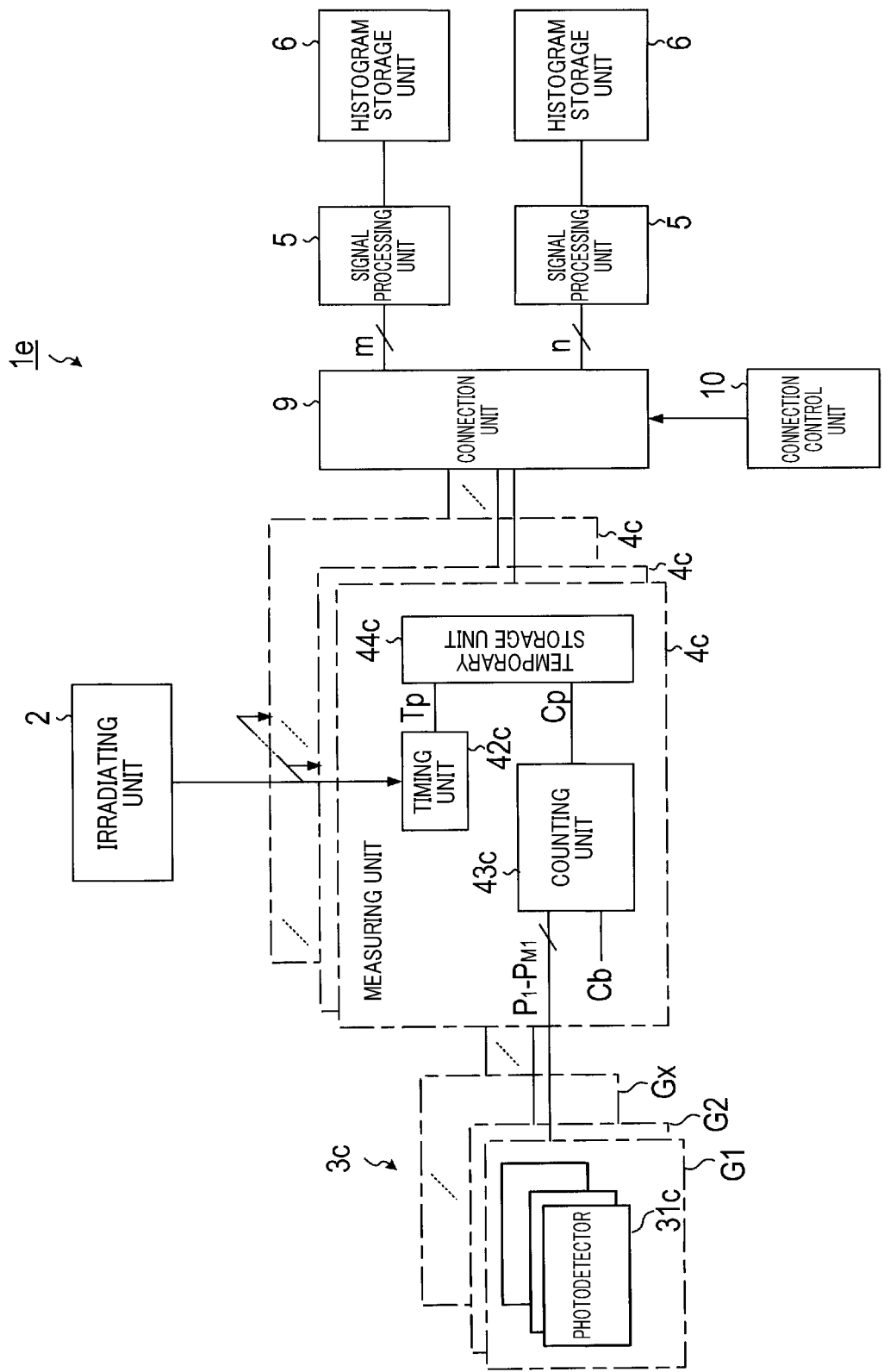
FIG. 14 is a block diagram showing the configuration of a variation of the third embodiment.

(5j) The laser radar 1c of the fourth embodiment described above has a structure in which the light receiving array unit 3 and the measuring units 4 in the laser radar 1 of the first embodiment are replaced with the light receiving array unit 3c and the measuring units 4c. However, the present disclosure is not limited to this. For example, the laser radar 1c may have a structure in which the light receiving array unit 3 and the measuring units 4 in the laser radar 1a of the second embodiment are replaced with the light receiving array unit 3c and the measuring units 4c, similarly to the laser radar 1d shown in FIG. 13. Alternatively, the laser radar 1c may have a structure in which the light receiving array unit 3 and the measuring units 4 in the laser radar 1b of the third embodiment are replaced with the light receiving array unit 3c and the measuring units 4c, similarly to the laser radar 1e shown in FIG. 14.

(5k) A plurality of functions owned by one component in the above-described embodiments may be realized by a plurality of components, or one function owned by one component may be realized by a plurality of components. In addition, a plurality of functions owned by a plurality of components may be realized by one component, or one function realized by a plurality of components may be realized by one component. In addition, part of the configurations of the above-described embodiments may be omitted. In addition, at least part of the configurations of the above-described embodiments may be added to or replaced with any other configurations of the above-described embodiments. All aspects falling within the technical idea specified from the wording of the claims are embodiments of the present disclosure.

(5l) In addition to the optical measuring device described above, the present disclosure can also be realized in various forms such as a system including the optical measuring device as a component and a method for measuring a light signal.

What is claimed is:

1. An optical measuring device comprising:
   a light receiving array unit configured in such a manner that a plurality of photodetectors each output a pulse signal in response to incidence of a photon form a light receiving group and that a plurality of the light receiving groups form one pixel, the light receiving array unit being provided with one or more of the pixels;
   a measuring unit provided for each of the plurality of light receiving groups, and the measuring unit being configured to generate time information representing an elapsed time from an irradiation timing input from outside and light quantity information acquired at each of one or more timings identified from the time information, in accordance with the pulse signal output from the light receiving group; and
   a signal processing unit configured to determine a time of flight of light in accordance with at least one of the time information and the light quantity information measured at a plurality of the measuring units corresponding to the one pixel, wherein
   the number of the photodetectors outputting the pulse signal among the plurality of photodetectors belonging to the light receiving group is used as the light quantity information.

2. The optical measuring device according to claim 1, wherein
   the number of the signal processing units is plural; and
   the optical measuring device further comprising:
   a rear-positioned connection unit configured to connect each of the plurality of measuring units to any of the plurality of signal processing units; and
   a rear-positioned control unit configured to change the connection by the rear-positioned connection unit to change an area in the pixel processed by the plurality of signal processing units.

3. The optical measuring device according to claim 2, wherein
   the rear-positioned control unit is configured to acquire situation information representing a situation in which the optical measuring device is used and to change the connection at the rear-positioned connection unit in accordance with the acquired situation information.

4. The optical measuring device according to claim 3, wherein
   the rear-positioned control unit is configured to estimate a distance to a target to be measured from the situation information and to change the number of the connections of the measuring units to each of the plurality of signal processing units based on the estimated distance to the target to be measured.

5. The optical measuring device according to claim 1 further comprising:
   a front-positioned connection unit configured to connect each of the plurality of photodetectors included in the one pixel to one of the plurality of measuring units; and
   a front-positioned control unit configured to change the connection by the front-positioned connection unit to change the organization of the light receiving groups.

6. The optical measuring device according to claim 5, wherein
   the front-positioned control unit is configured to acquire situation information representing a situation in which the optical measuring device is used and to change the connection at the front-positioned connection unit in accordance with the acquired situation information.

7. The optical measuring device according to claim 6, wherein
the front-positioned control unit is configured to estimate a tendency of brightness at the target to be measured from the situation information and to change at least one of the number of the photodetectors forming the light receiving group, and the size and the shape of the pixel formed by the light receiving group based on the tendency of brightness.

8. The optical measuring device according to claim 1, wherein
the signal processing unit includes a histogram generating unit configured to integrate a value represented by the light quantity information at each time represented by the time information in accordance with the time information and the light quantity information measured at the plurality of measuring units to generate a histogram.

9. The optical measuring device according to claim 8, wherein
the plurality of measuring units each includes a temporary storage unit configured to store the light quantity information and the time information, and
the histogram generating unit is configured to generate the histogram in accordance with the information stored in the temporary storage unit provided for each of the plurality of measuring units.

10. The optical measuring device according to claim 9, the histogram generating unit comprising:
a comparison unit configured to compare the time information stored in the temporary storage unit provided for each of the plurality of measuring units to read out the time information and the light quantity information associated with the time information from the smallest value of the time information; and
a memory control unit configured to update the contents of a memory in which the histogram is stored in accordance with the time information and the light quantity information read out at the comparison unit.

11. The optical measuring device according to claim 10, wherein
the comparison unit is configured to supply a result of addition of a plurality of pieces of the light quantity information to the memory control unit, in response to the plurality of pieces of light quantity information which are identical in the time information being read from the different temporary storage units.

12. The optical measuring device according to claim 9, wherein
the temporary storage unit is configured to store the light quantity information at an address associated with the time information.

13. The optical measuring device according to claim 1, the measuring unit comprising:
a timing unit configured to output, as the time information, a count value obtained by counting an elapsed time from the irradiation timing in accordance with a clock; and
a counting unit configured to generate the light quantity information each time when the time information changes.

14. The optical measuring device according to claim 1, the measuring unit comprising:
a trigger unit configured to output a trigger signal representing a light receiving timing of a light signal incident on the light receiving group, when the number of the pulse signals output simultaneously from the light receiving group is a trigger threshold value or larger;
a timing unit configured to output, as the time information, a time from the irradiation timing to the light receiving timing; and
a counting unit configured to generate the light quantity information each time when the trigger signal is output.

* * * * *